(12) United States Patent
Hartzell

(10) Patent No.: US 7,156,916 B2
(45) Date of Patent: *Jan. 2, 2007

(54) MONOLITHIC INTEGRATED CRYSTAL-STRUCTURE-PROCESSED MECHANICAL, AND COMBINED MECHANICAL AND ELECTRICAL DEVICES, AND METHODS AND SYSTEMS FOR MAKING

(75) Inventor: John W. Hartzell, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 627 days.

This patent is subject to a terminal disclaimer.

(21) Appl. No.: 10/131,549

(22) Filed: Apr. 23, 2002

(65) Prior Publication Data

US 2003/0197214 A1    Oct. 23, 2003

(51) Int. Cl.
*C30B 25/16* (2006.01)
(52) U.S. Cl. .................... 117/30; 117/2; 117/3; 117/4; 117/37; 117/904
(58) Field of Classification Search ............ 117/2, 117/3, 4, 30, 37, 904
See application file for complete search history.

(56) References Cited

U.S. PATENT DOCUMENTS

| | | | |
|---|---|---|---|
| 6,016,686 A | 1/2000 | Thundat | 73/23.2 |
| 6,176,922 B1* | 1/2001 | Aklufi et al. | 117/4 |
| 6,322,625 B1 | 11/2001 | Im | 117/43 |
| 6,558,802 B1* | 5/2003 | Henley et al. | 428/446 |
| 6,860,939 B1* | 3/2005 | Hartzell | 117/43 |

FOREIGN PATENT DOCUMENTS

| | | | |
|---|---|---|---|
| WO | WO 97/45827 | * | 12/1997 |
| WO | WO 01/18854 A1 | | 3/2001 |
| WO | WO 01/18855 A1 | | 3/2001 |
| WO | WO 01/71791 A1 | | 9/2001 |

OTHER PUBLICATIONS

Article entitled, "Origin of Nanomechanical Cantilever Motion Generated from Biomolecular Interactions", by Wu et al., published in PNAS, Feb. 13, 2001, vol. 98, No. 4, pp. 1560-1564.
Article entitled, "Analysis of Amplification of Thermal Vibrations of a Microcantilever" by Muralidharan et al., published in Journal of Applied Physics, vol. 89, No. 8, Apr. 15, 2001, pp. 45874591.
Article entitled, "Cantilever-Based Optical Deflection Assay for Discrimination of DNA Single-Nucleotide Mismatches", by Hansen et al., published in Analytical Chemistry, Vo. 73, No. 7, Apr. 1, 2001, pp. 1567-1571.
Article entitled, "Manipulation and controlled Amplification of Brownian Motion of Microcantilever Sensors", by Mehta et al., published in Applied Physics Letters, vol. 78, No. 11, Mar. 12, 2001, pp. 1637-1639.
Article entitled, "Measuring Magnetic Susceptibilities of Nanogram Quantities of Materials Using Microcantilevers", by Finot et al., published in Ultramicroscopy 86 (2001), pp. 175-180.

(Continued)

*Primary Examiner*—Felisa Hiteshew
(74) *Attorney, Agent, or Firm*—David C. Ripma

(57) ABSTRACT

Monolithic integrated crystalline-structure-processed arrays of mechanical, and combined mechanical and electrical devices, and related systems and processing methods.

24 Claims, 3 Drawing Sheets

OTHER PUBLICATIONS

Paper entitled, "Sustaining Self-Driven Oscillations in Microcantilevers—Criteria Obtained Using the Beam Equation", by Passian et al., dated Oct. 5, 2001, pp. 1-35.

Article entitled, "In SITU Detection of Calcium Ions with Chemically Modified Microcantilevers", by Ji et al., published in Biosensors & Bioelectronics 000 (2001) 000-000, pp. 1-7.

Article entitled, "Detection of pH Variation Using Modified Microcantilever Sensors" by Ji et al., published in Sensors & Actuators B 3641 (2001) pp. 1-6.

Paper entitled, "MEMS Sensors and Wireless Telemetry for High-Sensitivity Chemical and Biological Sensing", by Britton et al., consisting of 12 pages.

Article entitled, "Investigation of Adsorption and absorption-induced stresses using Microcantilever Sensors" by Hu et al. published in Journal of Applied Physics, Jul. 15, 2001, vol. 90, No. 2, pp. 1-5.

Article entitled, "Chemical Sensing in Fourier Space", by Thundat et al., published in Applied Physics Letters, vol. 77, No. 25, Dec. 18, 2000, pp. 1-3.

Article entitled, "Bioassay of Prostate-Specific Antigen (PSA) Using Microcantilevers", by Wu et al., published in Nature Biotechnology, Vo. 19, Sep. 2001, pp. 856-860.

Article entitled, "New MEMS Technology Using Multi-Layer NILC Poly-Si and NiSi Films", by Cheung et al., published in Mat. Res. Soc. Symp. Proc. vol. 687, pp. B5-24.1-B5.24.6.

* cited by examiner

MONOLITHIC INTEGRATED CRYSTAL-STRUCTURE-PROCESSED MECHANICAL, AND COMBINED MECHANICAL AND ELECTRICAL DEVICES, AND METHODS AND SYSTEMS FOR MAKING

BACKGROUND AND SUMMARY OF THE INVENTION

The present invention arises from a new area of recognition and development focused on the technology of low-temperature, crystalline-structure-processed devices, and in particular mechanical, mechanical and electrical, so-called MEMS (micro-electromechanical), layered and stacked devices, and devices organized into monolithic arrays in layers, that opens up a broad new field of potential devices and applications not heretofore so inexpensively and conveniently made practical and practicable. This new field of possible devices, from which a number of inventions, one of which is specifically addressed in this disclosure, springs effectively from the recognition that internal crystalline-structure processing performed within the bodies of a wide variety of different materials, is capable of enabling fabrication of small (perhaps even down to devices formed form small molecular clusters), versatile, widely controllable and producible, accurate, mechanical, electromechanical and MEMS devices that can be formed very inexpensively, and, with respect to laser processing, in uncontrolled and room-temperature environments not requiring vacuum chambers, etc.

Especially, the invention offers significant opportunities for the building, relatively cheaply and very reliable, of very tiny mechanical devices that can be deployed in dense two-dimensional and three-dimensional complex arrays and stacked arrangements. These devices can take on a large range of different configurations, such as individuated, single-device configurations, monolithic single-layer array arrangements of like devices, similar monolithic arrays of combined electrical and mechanical devices, and in vertically integrated and assembled stacks and layers of complex devices, simply not achievable through conventional prior art processes and techniques. By enabling room-temperature fabrication, otherwise easily damaged and destroyed layer-supporting substrates, including fabricated-device under-layers, can readily be employed.

The field of discovery and recognition which underpins the invention disclosed herein, can be practiced with a very wide range of materials, such as non-semiconductor and semiconductor materials, piezoelectric materials, dielectric materials, in arrays that can be deployed on rigid substrates of various characters, and on a wide range of flexible materials, such as traditional flex-circuit materials (polymers and plastics), metallic foil materials, and even fabric materials. Additionally, the field of development from which the present invention emerges can be employed with large-dimension bulk materials, as well as with various thin-film materials. With regard to the latter category of materials, the process of this invention can take advantage of traditional thin-film processing techniques to shape and organize unique devices, which are otherwise prepared in accordance with the internal crystalline-structure-processing proposed by the present invention, thus to achieve and offer mechanical properties in a broad arena of new opportunities.

The invention can be summarized as one regarding system implementation of a method utilizing room-temperature internal crystal-structure-processing of a selected material to create monolithic arrays of both interactive and non-interactive mechanical, and combined mechanical and electrical, devices, with the mechanical devices in an array having both the three-dimensional configurations, and the required internal mechanical properties, for performing a chosen task. The invention is ideal for producing various MEMS devices.

From the drawings and the descriptions which now follow, it will become readily apparent how the present invention lends itself to the economic, versatile, multi-material fabrication and use of a large variety of devices, ranging from relatively large devices to extremely small devices (as mentioned earlier), and including various forms of MEMS devices, without the fabrication of these devices, insofar as laser processing in involved, necessitating the use of special controlled processing environments, or surrounding processing temperatures above typical room temperature.

In the context of this invention's applicability in many different settings, its description herein follows a preliminary foundation description regarding the creation of individual devices formed of many different materials, including relatively thin bulk materials, as well as isolated formation of monolithic arrays of devices produced in accordance with the invention. Those skilled in the art will recognize how these foundation descriptors enhance an understanding of the specifically focussed-upon invention embodiments.

With this in mind, the significant improvements and special contributions made to the art of device-fabrication according to the invention will become more fully apparent as the invention description which now follows is read in conjunction with the accompanying drawings.

DESCRIPTION OF THE DRAWINGS

FIG. 7, in particular, illustrates a condition where material that is being processed in accordance with the invention is resting on a substrate which is not transparent to the wash of illumination coming from the bottom side of FIG. 7.

In FIGS. 2, 3, 4, 5, 6, 7, 8, 12 and 13, the darkened regions in the material being processed represents the processed regions in these materials.

DETAILED DESCRIPTION OF THE INVENTION

Figure 1:
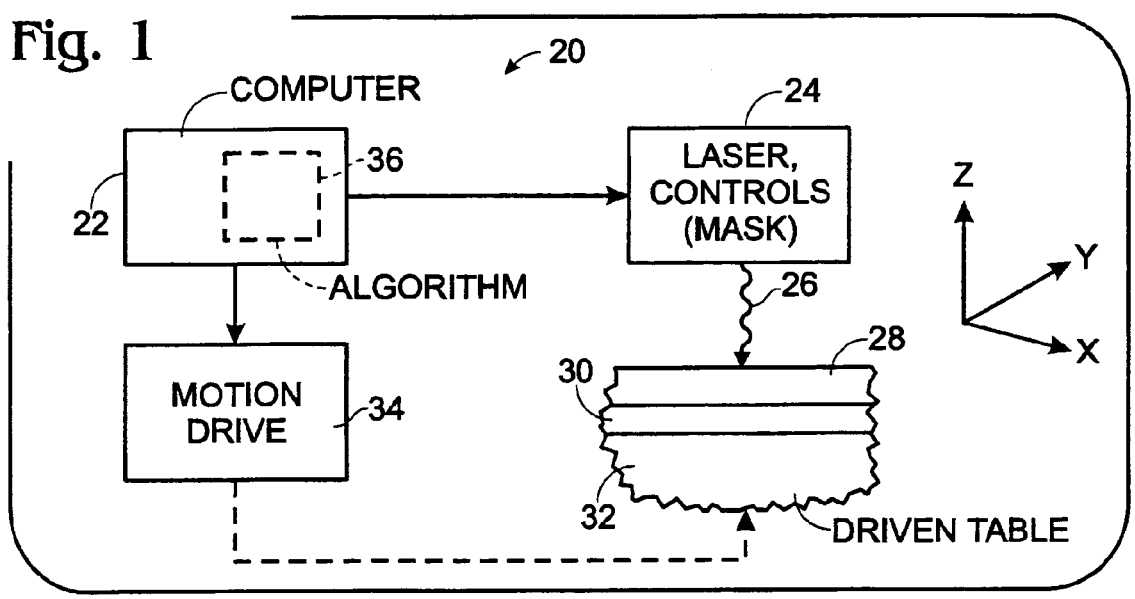
FIG. 1 is a block/schematic view illustrating a system which implements the methodology of this invention for the creation of single or arrayed mechanical devices in accordance with the present invention.

Turning now to the drawings, and referring first of all to FIG. 1, illustrated generally at 20 is a system which is employed according to the present invention to implement a methodology for processing the internal crystalline structure of various different materials in accordance with the invention, and all for the purpose of creating one or more mechanical devices that are intended to perform respective, predetermined, pre-chosen tasks. Included in system 20 are a block 22 which represents a suitably programmed digital computer, a block 24 which is operatively connected to block 22, and which represents the presence of appropriate laser structure and controls, such as beam-shaping and optics control using optical or masking methods, fluency controls, angularity controls, masking controls, and other, for defining the functional characteristics of a appropriate laser beam shown at 26 which is to be employed in accordance with the invention to produce internal crystalline-structure processing of any one of a number of different materials, as will be more fully mentioned below. In FIG. 1, a material for processing is shown generally at 28, with this material having a layer form, and being suitably supported on an appropriate supporting substrate 30 which rests upon, and is anchored to, a three-axis translation table (a driven table) 32.

Table 32 is drivingly connected to a motion drive system, represented by block 34 in FIG. 1, which drive system is under the control of computer 22. This motion drive system, under the control and influence of computer 22, is capable of translating table 32, and thus material supported on this table, in each of the three usual orthogonal axes known as the X, Y, and Z axes, such axes being pictured at the right side of FIG. 1. Very specifically, control over motion of table 32 is directed by an appropriate algorithm 36 which is resident within computer 22, and which, fundamentally, is equipped to direct a laser beam for processing in accordance with device configuration and device internal mechanical properties that have been chosen and selected, and for which algorithm 36 is especially designed.

The exact nature of the construction of computer 22, of controls 24, of algorithm 36, and of the driven table and the motion drive therefor, form no part of the present invention, and accordingly are not further detailed herein.

Fundamentally, what takes place in the operation of system 20 to produce a given type of mechanical device is that a user selects a particular kind of device to build, selects an appropriate size and configuration for that device, and then determines what are the best and most appropriate internal mechanical properties that should be created in that device in order to enable it to function properly with respect to implementing a selected task. In general terms, the materials out of which a particular material can be selected to produce such a device are those respective, whose internal crystalline structures are closely linked to the material's mechanical properties. Specifically, the various useable materials are those whose internal crystalline structures can be modified by laser processing to produce desired mechanical properties for a device. Various materials with respect to which the present invention can conveniently and very successfully work will be discussed very shortly, but it might be noted at this point that these materials, with respect to their precursor states, i.e. their states before processing, range from fully amorphous materials through and into a range of various categories of polycrystalline materials.

For example, practice of the invention can begin with precursor material which can fit into any one of the following categories: amorphous, nanocrystalline, micro-crystalline, polycrystalline, and bulk. All such materials can be generally described as having an internal crystalline structure which, initially in a precursor state, is less than single crystalline in nature.

Materials which can very successfully be processed in accordance with this invention include silicon, germanium, silicon-germanium, various dielectric materials, various piezoelectric materials, copper, aluminum, and titanium to name a few. For the purpose of further illustration in this description, a manner of practicing the invention, and a device emerging from that practice, will be described in conjunction with full-layer-depth processing of a precursor amorphous silicon material, which will thus be treated as the specific kind of material which is pictured at 28 in FIG. 1. Also for the purpose of focused illustration herein, this precursor illustrative amorphous silicon material is deployed as an appropriate layer on a glass substrate, which is designated by reference numbered 30 in FIG. 1. Other substrate materials, as will become apparent, may include quartz, various metals, plastics, flex materials, fabrics and others. All of these materials have what are referred herein as relatively low melting (or destruction) temperatures which are well below the melting temperature of the silicon precursor material.

As has already been suggested above, practice of the present invention can produce a wide variety of uniquely configured and constructed mechanical devices which can be extremely small in size, ranging down even to a small molecular cluster size. Devices which can be produced include various MEMS devices, micro-mechanical devices that are sensitized to act as sensors for various environmental events, such as chemical and biological events, various motion elements generally, oscillating elements, cantilever beams, actuators, relay switches, and other devices.

With respect to formation of a particular device's three-dimensional configuration, this can be done in any one of a number of conventionally known ways. The exact processes employed to give three-dimensional definition to a finally produced device, as for example to singulate an element from a mass of material in which it has been formed, and/or to individuate (for performance purposes) plural devices in a monolithic array of devices, can take the form of various conventional processes which form no particular parts of the present invention. Thus they are not discussed herein in detail.

For the purpose of illustration herein, processing will be described in the setting, initially, of creating a single micro-mechanical cantilever mechanical device, using single-side, translated laser-beam processing. While various specific types of lasers can be employed, such as an excimer laser, a solid-state laser, a continuos-wave laser and a femto laser to name several, description will proceed in the context of using an excimer laser.

Describing now a typical practice implemented by the present invention, an amorphous silicon layer having a precursor thickness lying, for example, in the range of about 0.05 microns to perhaps above 1.0 microns is suitably formed on or attached to the surface in a glass substrate, such as substrate 30. This assembly is placed on table 32 with appropriate initial alignment, and is then translated relatively with respect to a laser beam, such as excimer laser beam 26, which beam is pulsed during translation of the material relative to the source of the laser beam, to produce full-depth, small-area quick melting and re-crystallizing of the silicon material. An appropriate excimerlaser, driven and pulsed at an appropriate pulse rate, and with an appropriate fluency and footprint in the sense of how and with what outlines it strikes the surface of the amorphous silicon material, is directed toward this surface under the control of computer 22, algorithm 36, and controls 24

In accordance with the desired end-result internal crystalline structure, and in a relative motion sense, the impingement point of this beam from a laser is moved in a defined way over the surface of the amorphous silicon material to produce rapid, full-depth melting and re-crystallizing in a manner designed to achieve the pre-determined desired internal crystalline structure. Employing an excimer laser in this fashion allows one to process material in such a fashion that the high-temperature events are essentially confined very locally to the regions specifically where material melt is occurring. Very little, and no dangerous, temperature rise occurs in the surrounding area, such as within substrate 30, and the whole process can take place in a normal atmospheric environment and completely at room temperature.

Figure 2:
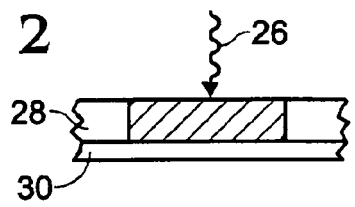
FIG. 2 is a schematic diagram illustrating single-side, full-depth internal-crystalline-structure laser processing to create a mechanical device in accordance with the invention.
Figure 3:
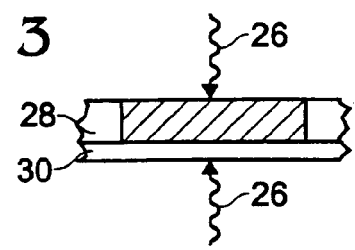
FIG. 3 is very similar to FIG. 2, except that here what is shown is two-sided processing according to the invention.
Figure 4:
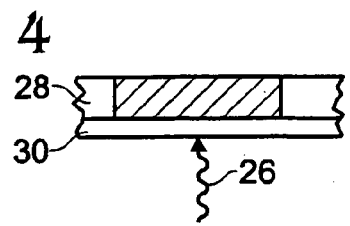
FIG. 4 is a view similar to FIG. 2, but here showing processing occurring from an opposite side of material in accordance with the invention.

FIGS. 2, 3 and 4 show several different approaches to implement such laser processing. In FIG. 2 the laser beam strikes the surface of the amorphous silicon material on the upper side which is spaced away from supporting substrate 30. Processed material is indicated (darkened) at 27. In FIG. 3 dual-sided processing takes place with two laser beams cooperating on opposite sides of the material, with the lower beam effectively processing the underside of the silicon material through the transparency afforded by glass substrate 30. Such dual-sided laser processing effectively allows melting and re-crystallizing to take place simultaneously on opposite sides of the supported silicon material, and with each laser, therefore, requiring only a portion of the power required for similar processing to take place under the influence of a single laser beam. Where a mask is employed for beam shaping, this dual-laser approach promotes longer-term durability of such a mask—a typically expensive device which is subject to significant degradation at high laser power levels. Two-sided dual-beam processing can also be effective to allow processing to be performed in otherwise difficult to reach areas with just a single processing beam.

In FIG. 4 single-side processing is demonstrated where, in this case, the processing laser beam is directed toward the silicon material from the bottom side (i.e. the substrate supported side) of this material.

Figure 5:
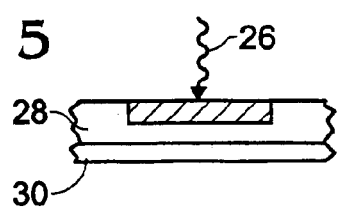
FIG. 5 is a view illustrating single-side, partial-depth internal-crystalline-structure processing according to the invention.

FIG. 5 illustrates single-side, less than full-depth processing of the silicon material, here employed to create ultimately a mechanical device which effectively becomes a device that is composited with unprocessed material lying beneath it, as illustrated in FIG. 5.

Figure 6:
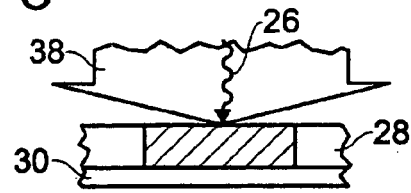
FIG. 6 is similar to FIG. 2, except that here single-side processing includes a flood, or wash, of general heating illumination according to one form of practicing the invention, with this illumination striking material on what is shown as the upper side in FIG. 6.
Figure 7:
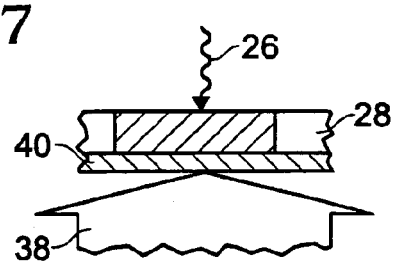
FIG. 7 is similar to FIG. 6, except that it illustrates two-sided processing wherein a relatively translated laser beam processes the upper side of material as pictured in FIG. 7, and a wash, or flood, of other illumination (from laser or another light source) aids from the bottom side of material as pictured in FIG. 7.
Figure 8:
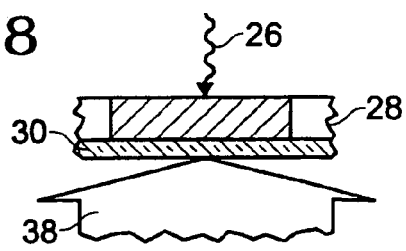
FIG. 8 is similar to FIG. 7, except that here the material being processed is resting on a substrate, such as glass, which is essentially transparent to a wash of illumination striking from the bottom side of FIG. 8.

FIGS. 6, 7 and 8 show different manners of modifying the kinds of laser processing illustrated in FIGS. 2–4 inclusive, and specifically a modified processing approach which employs an additional broad area wash of illumination 38 from another illumination source which could be, but is not necessarily, a laser source. In FIG. 6 this wash of illumination strikes the upper side of the silicon material in companionship with laser beam 26, and is effective essentially to create an overall temperature rise in the silicon material which permits a lower energy laser beam to perform appropriate full-depth processing. In FIGS. 7 and 8 this wash 38 of illumination is directed toward the underside of the silicon material and the supporting substrate, with FIG. 7 illustrating a condition where the substrate support material shown at 40 is not transparent to illumination. In this implementation of the invention, the silicon material which is being processed is heated in a conduction manner through heating of substrate 40. In FIG. 8, glass substrate 30 is again pictured, and here, the wash 38 of illumination passes through this substrate to heat the silicon material above the substrate directly.

According to practice of the invention, once a particular mechanical device to build has been decided upon, the desired three dimensional configuration of this device is chosen, and algorithm 36 is designed to direct laser processing in such a fashion as to create a regional volume of material within the processed material on the substrate adequate for the ultimate individuation and singulation, if that is what is desired, of an end-result mechanical device. With such a chosen device configuration in mind, the most desired internal mechanical properties are predetermined, and algorithm 36 is also constructed so that it will control the operation of a laser beam, such as beam 26, to produce internal melting and re-crystallization in order to achieve an internal crystalline structure that will yield the desired mechanical properties. In some instances, it may be more appropriate to create differentiated regions of crystalline structure within a device being built in order to produce different specific mechanical properties in different locations within that material. Such is entirely possible utilizing the processing approach which has just been outlined above.

Figure 9:
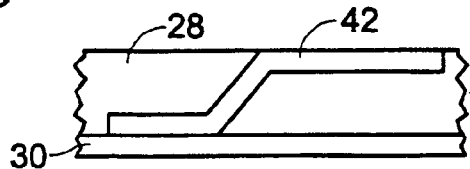
FIGS. 9 and 10 illustrate two different views of a stylized micro-cantilever beam structure (mechanical device) constructed in accordance with the invention.
Figure 10:
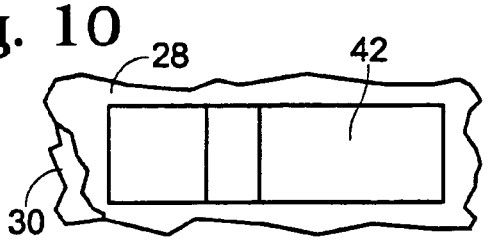

FIGS. 9 and 10 show a side cross section and an idealized top plan view of a stylized cantilever-beam mechanical device 42 which has been so defined by processing within the body of silicon material 28.

Figure 11:
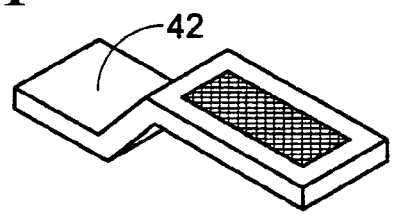
FIG. 11 shows an isolated view of a single micro-cantilever mechanical beam structure with a darkened region presented in this figure to illustrate, variously, sensitizing of a surface of the beam for the detection of a mechanical event, a chemical event, a biological event, etc. and also generally suggesting how, nested within the mechanical material making up the cantilever beam of FIG. 11 an electronic structure, such as a transistor, could be formed in a portion of the cantilever beam.

FIG. 11, in an idealized fashion, isolates an illustration of cantilever beam 42, and shows by way of suggestion, produced by the darkened patch which appears in FIG. 11, how an appropriate event sensor, such as a chemical sensor, a biological sensor, and other kinds of sensors could be applied, in any suitable manner, to the beam so as to respond to selected environmental events in a manner which causes deflection in the beam. The present invention is not concerned with the specific kinds of sensitivity for which a device, such as beam 42, is to be prepared, and thus details of how sensitizing can take place are not presented herein.

FIG. 11 can also be read to illustrate yet another interesting component offering of the present invention which is that it is possible to create within the mechanical body of the device, such as cantilever beam 42, an electronic device, such as a semiconductor transistor which can be thought of as being represented by the darkened patch appearing in FIG. 11.

Figure 12:
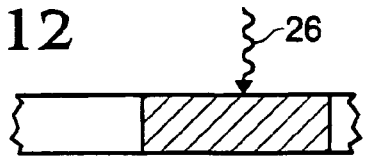
FIG. 12 is a view illustrating single-side, full-depth internal crystalline-structure processing of bulk material in accordance with the present invention.
Figure 13:
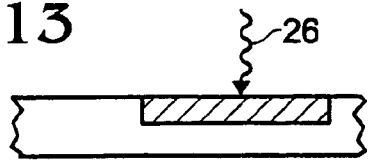
FIG. 13 is similar to FIG. 12, except that here what is shown is single-side, partial depth, bulk-material processing.

FIGS. 12 and 13 illustrate use of the invention to modify internal crystalline structure inside a bulk material 43, either with a full-depth approach (FIG. 12) or with a partial-depth approach (FIG. 13) in accordance with the invention.

Figure 14:
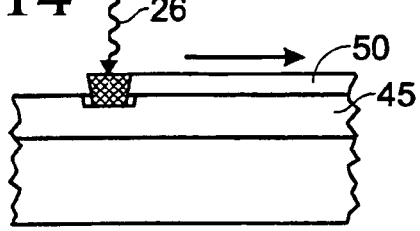
FIG. 14 is a view illustrating internal-crystalline-structure processing employing a single-crystal seed which is employed to characterize the end-result internal crystalline structure that can be achieved in the material pictured in FIG. 14.

FIG. 14 illustrates still another processing approach which utilizes a single-crystalline material seed 44 which rests in a tiny indentation formed in an appropriate layer 45 of a supporting material, such as silicon dioxide. Seed 44 lies adjacent an amorphous layer 50 of silicon. Laser processing takes place with initial illumination of the seed followed by laser-beam progression from the seed in a defined pattern over the amorphous silicon material. This action causes the single crystalline character of the seed 44 to become telegraphed into the internal structure of silicon layer 50, thus to characterize the internal crystalline structure in this layer to make it more nearly single crystalline in structure at the conclusion of processing.

Figure 15:
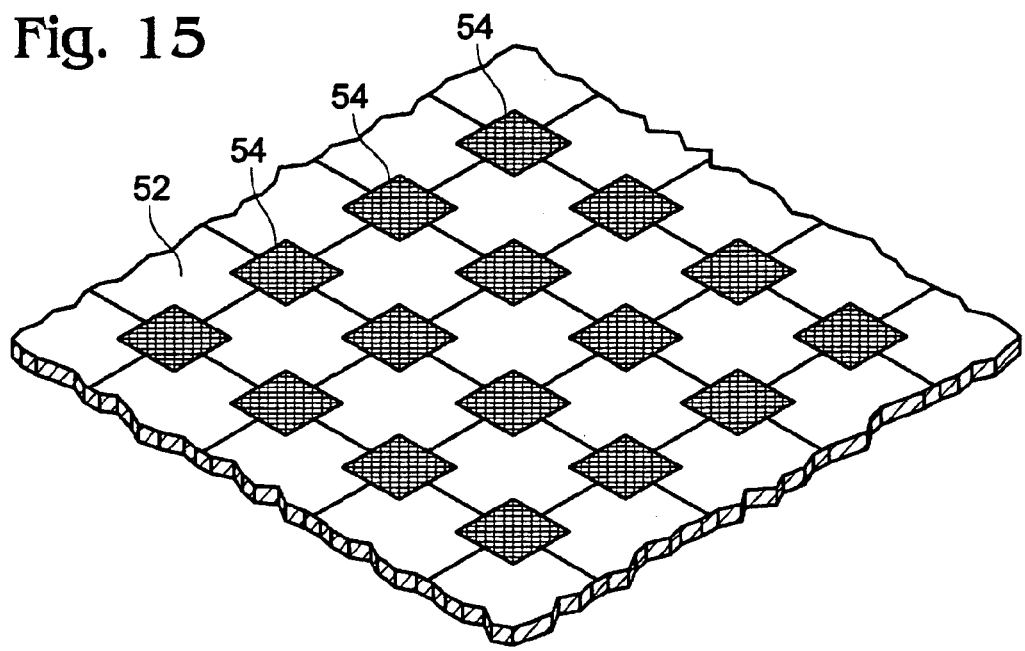
FIG. 15 is a stylized, schematic, isometric view illustrating fragmentarily a single planer array of plural mechanical devices prepared in a single monolithic, generally planar structure in accordance with the present invention.

FIG. 15 illustrates, in simplified fragmentary form, a monolithic layer structure 52 of processed, initially amorphous material which as been processed in an array fashion, and at discrete locations, to create a monolithic array of mechanical devices such as the devices shown as darkened rectangles at 54. While it is certainly possible that each and every one of devices 54 is essentially the same in construction, and intended to perform the same kind of function, it is entirely possible, according to practice of the invention, to differentiate the functionalities and thus the structures of these arrayed elements.

Figure 16:
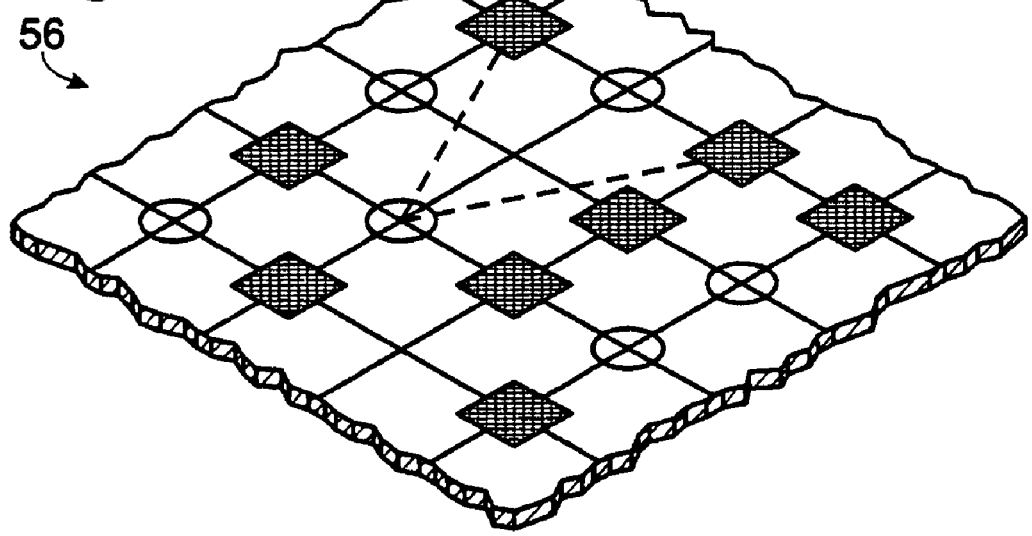
FIG. 16 presents a fragmented isometric view of a monolithic, single-layer array of both mechanical and electrical devices created in accordance with the present invention.

FIG. 16 shows fragmentarily at 56 a single-layer monolithic array with a combination of electrical and mechanical devices fabricated in accordance with the present invention. In this array, as was true with respect with the array pictured in FIG. 15, the darkened rectangles represent various mechanical devices produced in accordance with the invention. The open circles represent semiconductor devices, such as transistors which are made present in the array pictured in FIG. 16.

The practice of the present invention uniquely allows such a monolithic integration of combined mechanical and electrical, and of course electromechanical devices, built in accordance with the internal crystalline-structure-processing proposed by the present invention. Those devices pictured in the array of FIG. 16 which are not shown connected to any other device by a dashed line, while certainly connected in some fashion to other componentry, are, within the specific single array pictured in FIG. 16, non-interactive with one another. Those several devices (two mechanical devices, and one semiconductor device) shown interconnected by dashed lines are interactively interconnected.

Figure 17:
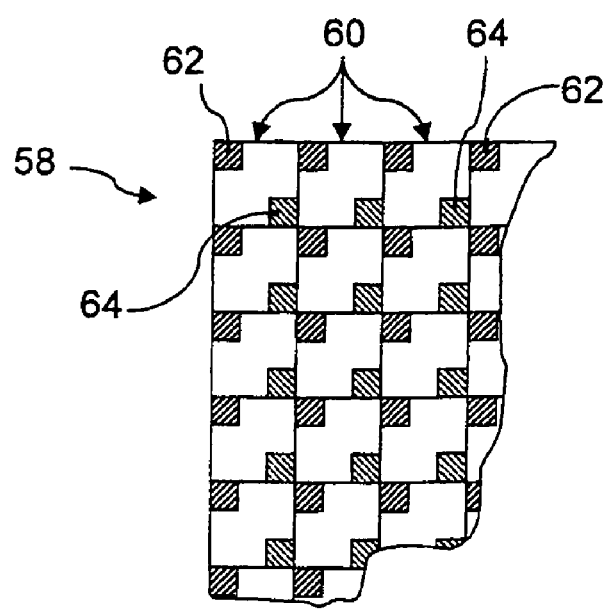
FIG. 17 is a fragmentary schematic view of a touch-screen structure made with devices in an array according to the present invention.

FIG. 17 illustrates a fragmentary representation of a touch-screen display which is made in accordance with the monolithic layer concepts of the present invention. This display, shown generally at 58, includes plural pixels, such as the several shown as squares at 60, and within each pixel, a semiconductor transistor 62 which is effective to activate the light behavior of the pixel, and also a mechanical, capacitor-sensitized device 64 made in accordance with the present invention. Touching this screen at the location of a pixel activates the mechanical device to produce an electrical signal based upon a capacitance change produced by motion in a cantilever beam which might typically form this mechanical device, and this activity is effective to send an appropriate signal to computer circuitry (not shown) to give an indication of just where, on the overall display screen, the user has touched the screen.

It will be apparent that the process proposed by the present invention, and the monolithic array arrangement made possible by practice of the invention, uniquely offer the opportunity to create a very effective and very efficient combined-device arrangement such as the touch screen arrangement pictured in FIG. 17.

In the context of fabricating a monolithic array of devices, an array which includes, in a continuous, single layer of material, both mechanical and electrical devices, the present invention provides a strikingly innovative fabrication approach. Very specifically, practice of this invention enables essentially the same substantially simultaneous fabrication process to perform a seamless, progressive, appropriately regionally differentiated formation of these two functionally different kinds of devices. Not only that, it also readily enables "generically" like devices (mechanical and electrical) to be specifically differentiated functionally one from another if so desired.

All control for accomplishing this remarkable fabrication ability, at least insofar as internal material working characteristics are concerned, rests essentially purely in "modulated" control over the way in which a processing illumination beam (or the like) addresses each area of beam/material impingement.

While various embodiments and manners of practicing the present invention have been illustrated and described herein, variations and modifications are possible without departing from the spirit of the invention.

I claim:

1. A method of forming, from a precursor material having selectively and controllably changeable crystalline-structure related mechanical properties, a monolithic array of mechanical devices each possessing (a) a predetermined configuration, and therein (b) a set of such mechanical properties, that are desired for the performance, by each completed device, of a pre-chosen mechanical task within the setting of the monolithic structure, said method comprising placing an appropriate broad-expanse precursor body of such material in a processing zone, selecting, for each device which is to be created, an associated volumetric region in that body which is suitable (a) for the creation therefrom of the desired configuration which is to be associated with that region, and (b) for the establishment therein of the desired set of associated, crystalline-structure-related mechanical properties, within the processing zone, subjecting each selected region to a controlled changing of the crystalline structure therein, and thus of the related mechanical properties, and by that process, achieving in each selected region, the associated, desired set of mechanical properties.

2. The method of claim 1 which further comprises additionally forming in such a monolithic array of mechanical devices, a similar array of electrical devices appropriately interspersed physically with the mechanical devices, and wherein the selecting step further includes selecting, for each electrical device, an associated volumetric region in the body of precursor material which is suitable (a) for the creation therein of the desired electrical device configuration, and (b) for the establishment in that associated region for each device of the desired set of crystalline-structure related electrical properties, and the subjecting step further includes effecting controlled changing of the crystalline structure in the electrical-device regions thus to produce the desired electrical properties in those regions, thereby to achieve the desired electrical devices.

3. The method of claim 2, wherein the body of material takes the form of a layer having a defined thickness, and said subjecting involves melting and re-crystallizing of zones in that layer through the full depth of the layer at the location of each zone.

4. The method of claim 2, wherein the body of material takes the form of a layer having a defined thickness, and said subjecting involves melting and re-crystallizing of zones in that layer through less than the full depth of the layer at the location of each zone.

5. The method of claim 2, wherein said subjecting is performed in a manner which differentiates and distinguishes different zones in a region, whereby such differentiated and distinguished zones possess, after the subjecting step, different internal properties.

6. The method of claim 2, wherein said subjecting is performed by a controlled energy beam which is directed toward a surface of the material body.

7. The method of claim 6, wherein the controlled energy beam takes the form of a laser beam.

8. The method of claim 7, wherein during the subjecting step, the location of beam-body impingement moves over the mentioned surface of the body.

9. The method of claim 2, wherein said subjecting is performed by a pair of controlled energy beams which are directed toward opposite surfaces in the material body.

10. The method of claim 9, wherein the controlled energy beams are laser beams.

11. The method of claim 10, wherein, during the subjecting step, the locations of beam-body impingement move over such opposite surfaces in the body.

12. The method of claim 2, wherein the controlled changing of crystalline structure produces an enlargement of internal grain size.

13. The method of claim 1, wherein the body of material takes the form of a layer having a defined thickness, and said subjecting involves melting and re-crystallizing of zones in that layer through the full depth of the layer at the location of each zone.

14. The method of claim 1, wherein the body of material takes the form of a layer having a defined thickness, and said subjecting involves melting and re-crystallizing of zones in that layer through less than the full depth of the layer at the location of each zone.

15. The method of claim 1, wherein said subjecting is performed in a manner which differentiates and distinguishes different zones in a region, whereby such differentiated and distinguished zones possess, after the subjecting step, different internal properties.

16. The method of claim 1, wherein said subjecting is performed by a controlled energy beam which is directed toward a surface of the material body.

17. The method of claim 16, wherein the controlled energy beam takes the form of a laser beam.

18. The method of claim 17, wherein during the subjecting step, the location of beam-body impingement moves over the mentioned surface of the body.

19. The method of claim 1, wherein said subjecting is performed by a pair of controlled energy beams which are directed toward opposite surfaces in the material body.

20. The method of claim 19, wherein the controlled energy beams are laser beams.

21. The method of claim 20, wherein, during the subjecting step, the locations of beam-body impingement move over such opposite surfaces in the body.

22. The method of claim 1, wherein the controlled changing of crystalline structure produces an enlargement of internal grain size.

23. A monolithic array of mechanical devices, each having a predetermined configuration, and a set of internal mechanical properties, said array comprising
  a broad-expanse body of a material which has selectively and controllable changeable crystalline-structure related mechanical properties, and
  a distribution over and within said body of an array of plural mechanical devices, each characterized by processed internal mechanical properties which have resulted from prior processing of the body to change internal crystalline structure within the region of the body which defines the mechanical device.

24. The array of claim 23 which further includes a distribution of plural electrical devices which have also resulted from like prior processing of the body to change internal crystalline structure within the region of the body which defines the electrical device.

* * * * *